(12) United States Patent
Jiang et al.

(10) Patent No.: US 12,267,018 B2
(45) Date of Patent: Apr. 1, 2025

(54) POWER SUPPLY CIRCUIT AND CHARGING DEVICE

(71) Applicant: GUANGDONG OPPO MOBILE TELECOMMUNICATIONS CORP., LTD., Dongguan (CN)

(72) Inventors: Senlong Jiang, Dongguan (CN); Chih-wei Chiu, Dongguan (CN); Jialiang Zhang, Dongguan (CN); Chen Tian, Dongguan (CN); Jun Zhang, Dongguan (CN)

(73) Assignee: GUANGDONG OPPO MOBILE TELECOMMUNICATIONS CORP., LTD. (CN)

( * ) Notice: Subject to any disclaimer, the term of this patent is extended or adjusted under 35 U.S.C. 154(b) by 238 days.

(21) Appl. No.: 17/941,689

(22) Filed: Sep. 9, 2022

(65) Prior Publication Data

US 2023/0006557 A1 Jan. 5, 2023

Related U.S. Application Data

(63) Continuation of application No. PCT/CN2021/078536, filed on Mar. 1, 2021.

(30) Foreign Application Priority Data

Mar. 12, 2020 (CN) .......................... 202010172177.5

(51) Int. Cl.
*H02M 3/335* (2006.01)
*H02M 1/08* (2006.01)
(Continued)

(52) U.S. Cl.
CPC ............. *H02M 3/335* (2013.01); *H02M 1/08* (2013.01); *H02M 7/219* (2013.01); *H03K 3/57* (2013.01)

(58) Field of Classification Search
CPC ......... H02M 3/335; H02M 1/08; H02M 7/219
(Continued)

(56) References Cited

U.S. PATENT DOCUMENTS

2006/0139823 A1 6/2006 Shoji et al.
2011/0216560 A1 9/2011 Ye
(Continued)

FOREIGN PATENT DOCUMENTS

CN 101399498 A 4/2009
CN 101572484 A 11/2009
(Continued)

OTHER PUBLICATIONS

The supplementary European search report dated Aug. 24, 2023 from European patent Application No. 21768050.3.
(Continued)

*Primary Examiner* — Yemane Mehari
(74) *Attorney, Agent, or Firm* — Quarles & Brady LLP

(57) ABSTRACT

Provided by the present disclosure are a power supply circuit and a charging device. The power supply circuit comprises a pulse transformer circuit and a first power supply conversion circuit. The pulse transformer circuit comprises a pulse transformer and a switch control circuit; a primary winding of the pulse transformer is connected to a power supply and is connected to the switch control circuit, and the switch control circuit is used to modulate the voltage on the primary winding into a pulse voltage; and the input terminal of the first power supply conversion circuit is connected to a secondary winding of the pulse transformer, and is used to transform the voltage on the secondary winding of the pulse transformer into a first preset voltage range when the voltage outputted by the secondary winding exceeds the first preset voltage range, and then output the voltage.

20 Claims, 6 Drawing Sheets

(51) Int. Cl.
*H02M 7/219* (2006.01)
*H03K 3/57* (2006.01)

(58) Field of Classification Search
USPC .......................................................... 363/17
See application file for complete search history.

(56) References Cited

U.S. PATENT DOCUMENTS

| | | | | |
|---|---|---|---|---|
| 2013/0141947 | A1* | 6/2013 | Sakurai | H02M 3/33523 |
| | | | | 363/21.16 |
| 2016/0028313 | A1* | 1/2016 | Kong | H02M 1/08 |
| | | | | 363/21.12 |
| 2016/0365802 | A1* | 12/2016 | Freeman | H02M 1/36 |
| 2017/0141690 | A1* | 5/2017 | Sakurai | H02M 1/36 |
| 2017/0373584 | A1* | 12/2017 | Hiyama | H02M 1/36 |
| 2018/0034378 | A1* | 2/2018 | Lin | H02M 1/08 |

FOREIGN PATENT DOCUMENTS

| | | |
|---|---|---|
| CN | 101834539 A | 9/2010 |
| CN | 201766507 U | 3/2011 |
| CN | 102118115 A | 7/2011 |
| CN | 204696929 U | 10/2015 |
| CN | 105340166 A | 2/2016 |
| CN | 107666245 A | 2/2018 |
| CN | 108832822 A | 11/2018 |
| EP | 2919358 A1 | 9/2015 |
| KR | 101203882 B1 | 11/2012 |

OTHER PUBLICATIONS

International Search Report and the Written Opinion dated May 26, 2021 from the International Searching Authority Re. Application No. PCT/CN2021/078536.

The First Office Action dated Sep. 7, 2024 from Chinese patent application No. 202010172177.5.

* cited by examiner

POWER SUPPLY CIRCUIT AND CHARGING DEVICE

CROSS REFERENCE

This application is a continuation of International Application No. PCT/CN2021/078536 filed on Mar. 1, 2021. The international Application claims priority to Chinese patent application No. 202010172177.5, filed on Mar. 12, 2020, entitled "POWER SUPPLY CIRCUIT AND CHARGING DEVICE", the entire contents of which are incorporated herein by reference in their entirety.

BACKGROUND OF DISCLOSURE

Field of the Disclosure

The present disclosure relates to the field of charging technology, and specifically to a power supply circuit and a charging device.

Description of the Related Art

With development of charging technology, a charging device is required to have different levels of voltage output capabilities. For example, when the charging device charges a mobile phone that supports a PD protocol, an output voltage of the charging device needs to be a form of continuously adjustable direct current.

In the related art, a pulse transformer is usually provided in the charging device, so that pulse modulation is performed by a voltage on a primary side of the pulse transformer of a PWM control chip to adjust a voltage at an output terminal of the pulse transformer. However, because a turns ratio of the pulse transformer is generally fixed, if it wants to realize that the output terminal of the pulse transformer outputs the form of continuously adjustable direct current, then a voltage of a power supply needs to be within a certain range. Therefore, this scheme has higher requirements for a power supply. Once the voltage of the power supply fluctuates greatly or the supply voltage is too low or too high, a voltage adjustable range for the output terminal of the pulse transformer will be limited.

The above information disclosed in a background section is only used to enhance understanding of the background of the disclosure. Therefore, it may contain information that does not form the prior art already known to a person ordinarily skilled in the art.

SUMMARY

One objective of the present disclosure is to improve adaptability of a charging device to different power supplies to ensure an adjustable range of output voltage.

In order to solve the above-mentioned technical problems, the present disclosure adopts technical solutions as follows.

According to one aspect of the present disclosure, the present disclosure provides a power supply circuit that includes:

A transformer circuit includes a pulse transformer and a switch control circuit; wherein a primary winding of the pulse transformer is connected to a power supply and the switch control circuit, and the switch control circuit is used to modulate a voltage on the primary winding into a pulse voltage; and A first power supply conversion circuit, wherein an input terminal of the first power supply conversion circuit is connected to a secondary winding of the pulse transformer to convert a voltage on the secondary winding of the pulse transformer to be within a first preset voltage range and then to be output in the case of a voltage output by the secondary winding being out of the first preset voltage range.

According to another aspect of the present disclosure, a charging device is disclosed and includes a power supply inlet and a power supply circuit, wherein the power supply inlet is used to receive power supply.

BRIEF DESCRIPTION OF DRAWINGS

The above and other objects, features, and advantages of the present disclosure will become more apparent from the detailed description of exemplary embodiments thereof with reference to the accompanying drawings.

DETAILED DESCRIPTION OF EMBODIMENTS

Figure 1:
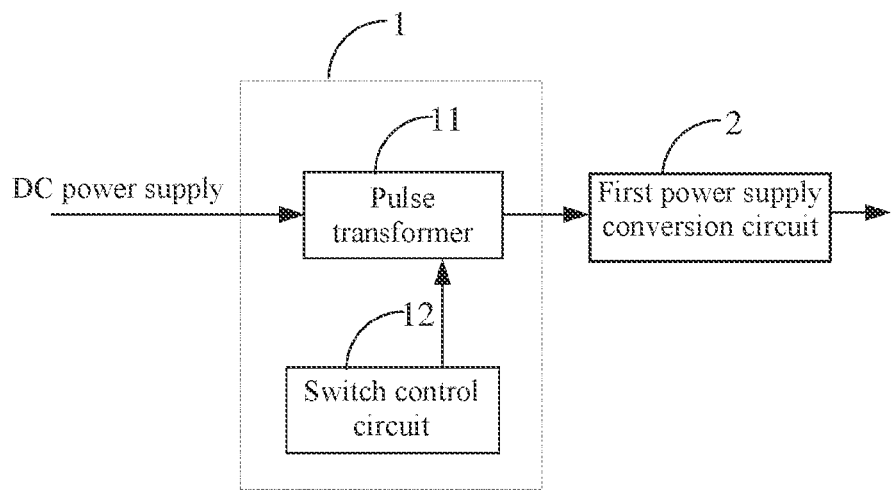
FIG. 1 is a block diagram illustrating a circuit structure of a power supply circuit according to an embodiment.

Exemplary embodiments will be described more comprehensively with reference to accompanying drawings. However, exemplary embodiments can be realized in various forms and should not be construed as limitations to the examples set forth herein. Instead, these embodiments are provided so that the present disclosure will be thorough and complete and will fully convey the concept of exemplary embodiments to those skilled in the art. The drawings are merely schematic illustrations of the present disclosure and are not necessarily drawn in scale. The same reference numerals in the drawings denote the same or similar parts, and thus their repeated descriptions will be omitted.

In addition, the described features, structures, or characteristics may be combined in any suitable manner in one or more embodiments. In the following description, numerous specific details are provided to give a thorough understanding of the embodiments of the present disclosure. However, those skilled in the art will appreciate that technical solutions of the present disclosure may be practiced without one or more specific details, or other methods, components, devices, steps, or the like may be employed. In other instances, well-known structures, methods, devices, implementations, materials, or operations have not been shown or described in detail to avoid obscuring aspects of the present disclosure.

In the present disclosure, unless otherwise expressly specified and limited, the terms "installed," "interconnected," "connected," or "fixed" should be understood in a broad sense. For example, it may be a fixed connection or a detachable connection, or integrated: it may be a mechanical connection, an electrical connection, or communication with each other; it can be directly connected or indirectly connected via an intermediate medium; it can be internal communication of two components or interaction relationship between the two components. For those ordinarily skilled in the art, specific meanings of the above terms in the present disclosure can be understood according to specific situations.

In addition, the terms "first" and "second" are only used for descriptive purposes, and should not be construed as indicating or implying relative importance or implying the number of indicated technical features. Thus, features defined as "first" or "second" may expressly or implicitly include one or more of that features. In the description of the present disclosure, "plurality" means at least two, such as two, three, and so on, unless expressly and specifically defined otherwise.

The preferred implementations of the present disclosure will be further elaborated below with reference to the accompanying drawings of the present specification.

The present disclosure provides a power supply circuit and a charging device. The charging device may be a charging apparatus, an adapter, or the like, for supplying power to an electronic device. Herein, the electronic device may be an intelligent or mobile terminal device equipped with a battery-powered system. The electronic device may also be but is not limited to, a rechargeable electronic device with a charging capability, such as a laptop, a mobile phone, an e-book reader, a smart wearable device, a mobile power supply (such as a power bank or a travel charger), an electronic cigarette, a wireless mouse, a wireless keyboard, a wireless headphone, a Bluetooth speaker, or the like.

The charging device includes a power supply inlet and a power supply circuit. The power supply inlet is used to receive an alternating current (AC) power supply. The charging device converts the AC power supply into a charging voltage and/or charging current allowed or required by the electronic device.

The charging device can operate in a voltage-following manner. Namely, an adapter and an electronic device to be charged conduct two-way communication. The adapter adjusts an output voltage and current according to a required charging voltage and current that the electronic device feeds back, so that the output voltage and current can be directly loaded on a battery of the electronic device to charge the battery. Thus, the electronic device does not need to adjust the charging voltage and current again.

Charging modes for a battery of an electronic device are roughly divided into a "normal-charging mode" and a "quick-charging mode." The normal-charging mode means that an adapter outputs a relatively low current value (usually less than 2.5 A) or charges a battery in a device to be charged with relatively low power (usually less than 15 W). It usually takes several hours to fully charge a large-capacity battery (such as a 3000 mAh battery) in the normal-charging mode. The quick-charging mode means that the adapter can output a relatively high current (usually greater than 2.5 A, such as 4.5 A, 5 A, or even higher) or charge the battery in the device to be charged with relatively high power (usually greater than or equal to 15 W). Compared with the normal-charging mode, the charging speed of the adapter in the quick-charging mode is faster, and the charging time that is required to charge the battery with the same capacity fully can be significantly shortened.

Please refer to FIG. 1, which is a block diagram illustrating a circuit structure of a power supply circuit according to an embodiment. In this embodiment, a power supply circuit is provided inside a charging device. The power supply circuit includes a pulse transformer circuit 1 and a first power supply conversion circuit 2. The pulse transformer circuit 1 includes a pulse transformer 11 and a switch control circuit 12. A primary winding of the pulse transformer 11 is provided to connect a power supply and the switch control circuit 12. The switch control circuit 12 is used to modulate a voltage on the primary winding into a pulse voltage. An input terminal of the first power supply conversion circuit 2 is connected to a secondary winding of the pulse transformer to convert a voltage on the secondary winding of the pulse transformer to be within a first preset voltage range and then to be output in the case of a voltage output by the secondary winding being out of the first preset voltage range.

The power supply connected to the primary winding of the pulse transformer is an externally connected power supply. For example, a direct current (DC) power supply input directly into the primary winding of the pulse transformer winding is used to chop and modulate an incoming line of the DC power supply by the pulse transformer, thereby obtaining a required voltage on the secondary winding of the pulse transformer. In one embodiment, the power supply circuit further includes a rectification circuit 3. An input terminal of the rectification circuit 3 is connected to the AC power supply to rectify the AC power supply. An output terminal of the rectification circuit 3 is connected to a first end of the primary winding of the pulse transformer. A second end of the primary winding of the pulse transformer is connected to the switch control circuit 12.

Figure 2:
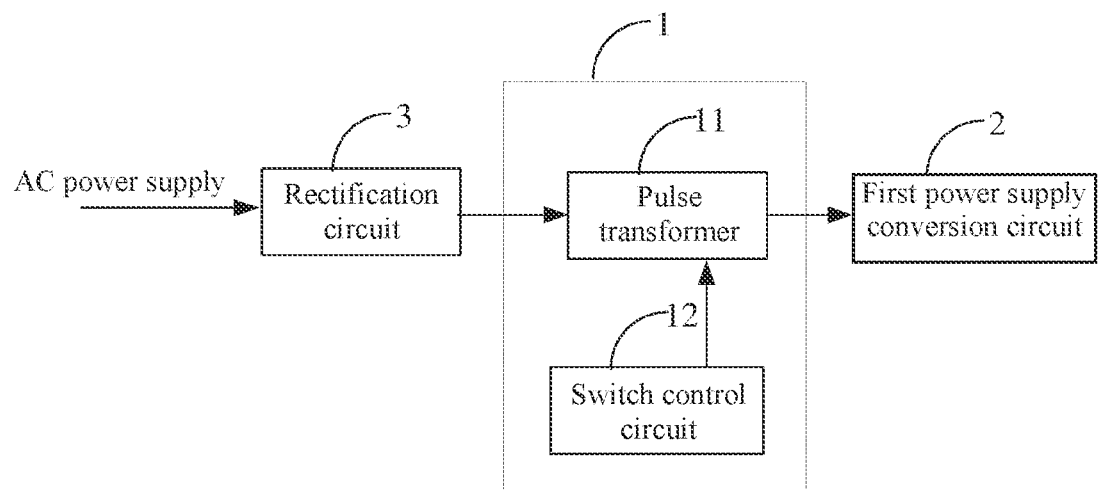
FIG. 2 is a block diagram illustrating a circuit structure of a power supply circuit according to another embodiment.
Figure 3:
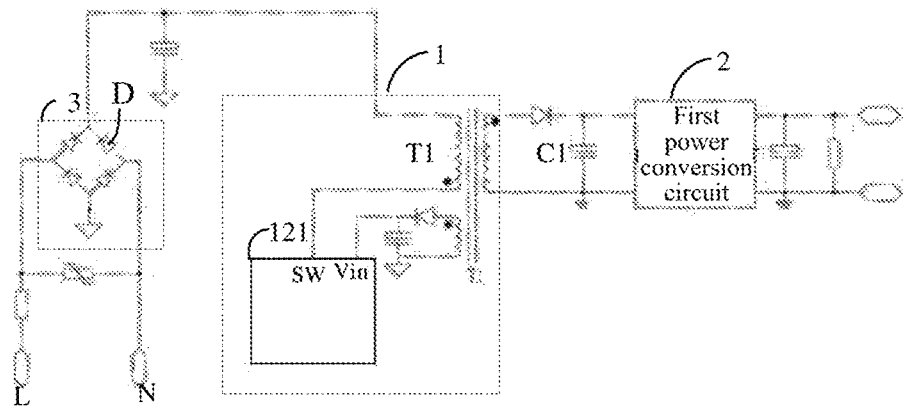
FIG. 3 is a circuit diagram illustrating a power supply circuit according to an example for FIG. 2.

Please refer to FIGS. 2 and 3, in which FIG. 2 is a block diagram illustrating a circuit structure of a power supply circuit according to an embodiment. FIG. 3 is a circuit diagram illustrating a power supply circuit according to an example for FIG. 2. The rectification circuit 3 may be a diode rectification circuit 3, a full-bridge rectification circuit 3, or a half-bridge rectification circuit 3 to perform full-wave rectification on the AC power supply. According to different selected conduction components, the rectification circuit 3 can be an uncontrollable rectification circuit 3, a half-controlled rectification circuit 3, or a fully-controlled rectification circuit 3. In the uncontrollable rectification circuit 3, rectification is completed in cooperation by a plurality of uncontrollable rectifier diodes D. The half-controlled rectification circuit 3 is composed of a mixture of controllable elements and diodes to complete rectification. In the fully-controlled rectification circuit 3, all rectifier elements are controllable (e.g., MOS transistors, SCRs, GTRs, GTOs, and the like). An average value and polarity of an output DC voltage of the fully-controlled rectification circuit 3 can be adjusted by controlling conducting conditions of elements.

In this embodiment, a diode rectification circuit 3 can be provided. Rectifier diodes in the full-bridge rectification circuit 3 or the half-bridge rectification circuit 3 are replaced with MOS transistors to reduce electric energy loss in the rectification circuit 3. Thus, under the case of the same input electric energy, an output voltage of the rectification circuit 3 can be stepped up.

The DC power supply formed by the AC power supply after being processed through the rectification circuit 3 is approximately a continuous steamed-bread wave. In one example, frequency of the steamed-bread wave is approximately 100 Hz. A filter circuit can also be provided, followed by the rectification circuit 3 to further smooth the steamed-bread wave. A pulse transformer T1 performs a chopping and modulating process to a DC power supply, thereby obtaining a required voltage on a secondary winding of the pulse transformer T1.

In one embodiment, a pulse transformer circuit 1 includes a pulse transformer T1, an AC-to-DC (AC-DC) power supply management chip 121, and a second feedback circuit. The AC-DC power supply management chip 121 has a switch control terminal SW and a power supply terminal Vin. A first end of the primary winding of the pulse transformer T1 is connected to the output terminal of the rectification circuit 3, and a second end of the primary winding is connected to the switch control terminal SW of the AC-DC power supply management chip 121. In this embodiment, the AC-DC power supply management chip 121 integrates switching transistors that are electrically connected to the primary winding of the pulse transformer T1 and a driving circuit that drives the switching transistors to be turned on and off. By controlling the switching transistors to be turned on and off, timing of transmitting electric energy from the primary winding of the pulse transformer T1 to the secondary winding is controlled. Because frequencies used for the switching transistors are relatively high (usually above 100 k), by rapidly switching the switching transistors, voltages on a primary coil of the pulse transformer T1 present a pulse-square wave. The secondary winding of the pulse transformer T1 outputs a constant voltage, and a specific voltage value is determined by a frequency of an output signal of the switch control terminal SW of the AC-DC power supply management chip 121. In another embodiment, the switching transistors can also exist independently of the AC-DC power supply management chip 121.

In the following embodiments, an embodiment of the first power supply conversion circuit 2 will be described.

The first power supply conversion circuit 2 mentioned in the above embodiments is connected to the secondary winding of the pulse transformer T1 to convert the voltage on the secondary winding of the pulse transformer T1 to be within the first preset voltage range and then to be output in the case of the voltage output by the secondary winding being out of the first preset voltage range. The above-mentioned first preset voltage range and a second preset voltage range (collectively referred to as the second preset voltage range) will be described together.

Figure 4:
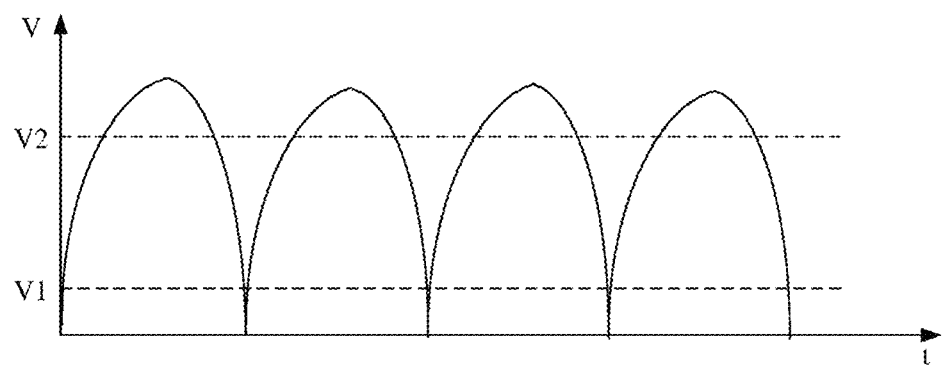
FIG. 4 illustrates a range corresponding to a preset voltage range on a voltage waveform for a secondary side of a pulse transformer according to an example.
Figure 5:
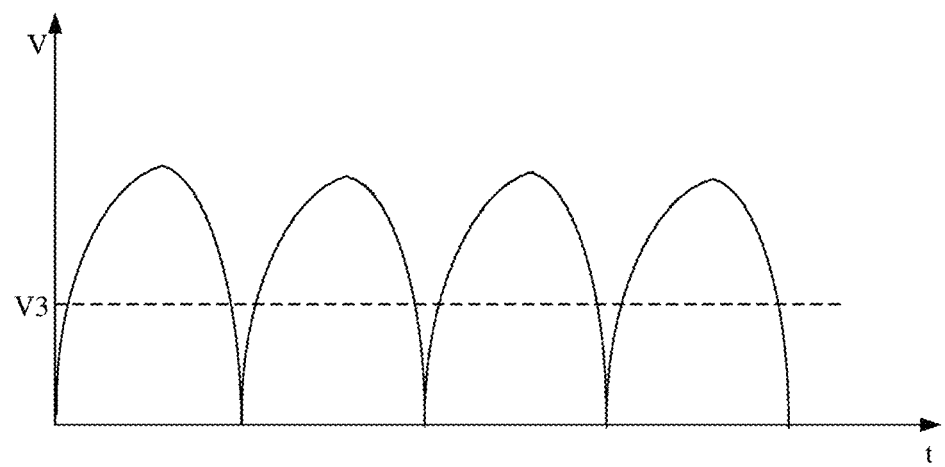
FIG. 5 illustrates a range corresponding to the preset voltage range on the voltage waveform for the secondary side of the pulse transformer according to another example.

Please refer to FIGS. 4 and 5. Two embodiments of the first preset voltage range are respectively illustrated in FIGS. 4 and 5. The first preset voltage range has an upper limit value V1 and a lower limit value V2. A voltage difference between the upper limit value V1 and the lower limit value V2 determines a size of the first preset voltage range. In FIG. 4, the upper limit value V1 and the lower limit value V2 of the first preset voltage range are different, and there is a relatively noticeable voltage difference between both of them, as long as a portion of the voltage of the secondary winding of the pulse transformer T1 out of the first preset voltage range is just adjusted to being within the first preset voltage range. In FIG. 4, the upper limit value V1 and the lower limit value V2 of the first preset voltage range are set to be the same or close to the same, and in this case, the first preset voltage range can be regarded as a specific preset voltage V3. Therefore, it is required that the first power supply conversion circuit 2 adjusts a range that is different from a value of the preset voltage to the preset voltage V3. Obviously, a manner of setting the first preset voltage range shown in FIG. 5 can make an output voltage of the power supply circuit more stable and accurate.

Because an output terminal of the first power supply conversion circuit 2 is an output terminal of the entire power supply circuit, the precise and stable output can better meet charging requirements of the device to be powered. Therefore, in one embodiment, the first preset voltage range is set to be a specific voltage value, wherein the upper limit value and the lower limit value of the first preset voltage range are the same. In the following embodiments, for ease of understanding, the upper limit value V1 and the lower limit value V2 used for the preset voltage are still described in combination with the relevant embodiments.

Figure 6:
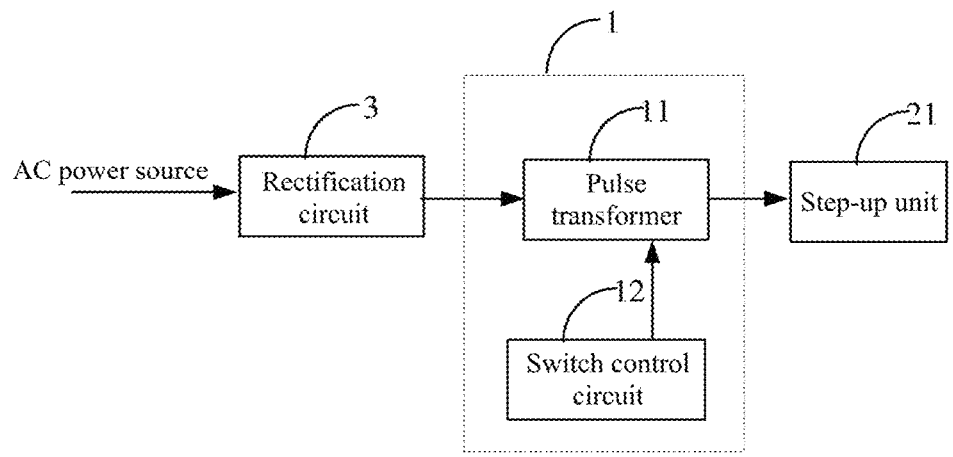
FIG. 6 is a schematic circuit diagram illustrating a power supply circuit according to another embodiment.

Please refer to FIG. 6, in one embodiment, in the case of a voltage of a power supply being relatively low, the voltage on the primary winding of the pulse transformer T1 is correspondingly low. Because a turns ratio of the pulse transformer T1 is fixed, a maximum voltage on the secondary winding of the pulse transformer T1 is correspondingly low. Therefore, in this embodiment, it is provided that the first power supply conversion circuit 2 includes a step-up unit 21. The step-up unit 21 is used to step up a voltage on the secondary winding of the pulse transformer T1 being below a lower limit value of the first preset voltage range in the case of an output voltage of the transformer circuit 1 being less than or equal to the lower limit value of the first preset voltage range.

In the case of the voltage output by the secondary winding of the pulse transformer T1 being lower than the lower limit value V2 of the preset voltage range, the step-up unit 21 will start to operate, so that a portion of the voltage output by the secondary winding of the pulse transformer T1 that is lower than the lower limit value V2 of the preset voltage range is stepped up.

The step-up unit 21 can step up the voltage output by the secondary winding of the pulse transformer T1 to a specific value, or step up the voltage output by the secondary winding of the pulse transformer T1 according to a specific multiple. The step-up unit 21 includes at least one of a BOOST circuit, a BUCK/BOOST circuit, a charge pump circuit, or a CUK circuit. It can be understood that each of the BUCK/BOOST circuit and the charge pump circuit can implement the step-up or step-down function as required. Herein, any one or any cascaded two of the BOOST circuit, the BUCK/BOOST circuit, the charge pump circuit, or the CUK circuit can be used to increase a step-up amplitude.

In one example, the step-up unit 21 is an uncontrollable circuit. An operation-starting threshold can be adjusted by selecting components such as resistors, capacitors, and inductors with appropriate parameters. In the case of the operation-starting threshold being set to the lower limit value V2 of the preset voltage range, once the output voltage of the rectification circuit 3 steps down to the lower limit value V2 of the preset voltage range, the step-up unit 21 is triggered to operate.

In another example, the step-up unit 21 is a controllable circuit. A unidirectional conduction device provided in the step-up unit 21 is a MOS transistor. The step-up unit 21 and the step-down unit 22 also include a first trigger circuit that is used to control the MOS transistor to be turned on and off, so that the first trigger circuit can trigger the step-up unit 21 to operate or stop operation by turning on and off the MOS transistor.

Figure 7:
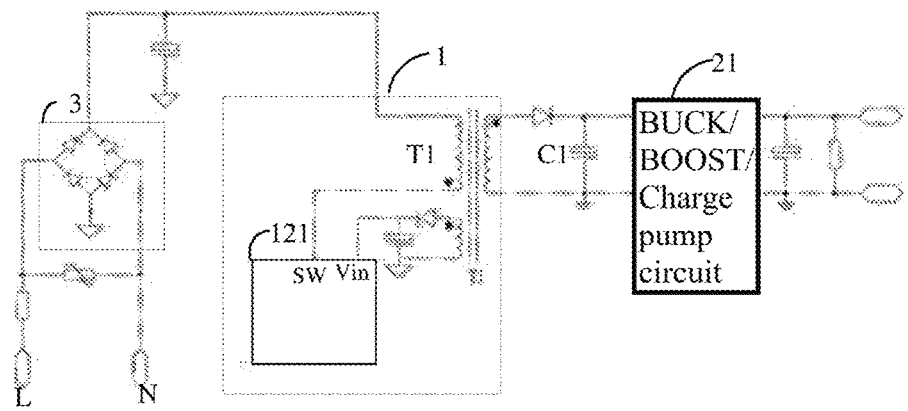
FIG. 7 is a schematic circuit diagram illustrating the power supply circuit according to an example for FIG. 6.

Please refer to FIG. 7, which is a schematic circuit diagram illustrating a power supply circuit according to another embodiment. For one example, a step-up unit 21 is a BOOST circuit. In the BOOST circuit 21, diodes can be replaced with MOS transistors, making the BOOST circuit a controllable circuit. In another aspect, because the MOS transistor has a low voltage drop, replacing diodes in the BOOST circuit with MOS transistors can also reduce electric energy loss of the BOOST circuit, which is beneficial to improve the output voltage of the BOOST circuit. For other step-up units 21, for example, diodes in the BUCK/BOOST circuit and the charge pump circuit can also be replaced with MOS transistors.

In the case of the step-up unit 21 being a controllable circuit, times for starting and stopping operations of the step-up unit 21 can be flexibly set as required, making that the step-up unit 21 can better cooperate with operations of the pulse transformer T1, thereby that the voltage processed by the step-up unit 21 can fully satisfy an operating voltage of the pulse transformer circuit 1. Therefore, in an embodiment, the step-up unit 21 further includes a first trigger circuit that is used to control the MOS transistor to be turned on and off. The first trigger circuit is used to control the step-up unit to start or stop an operation by controlling the MOS transistor in the step-up unit.

In one embodiment, in order to further step up the voltage output by the step-up unit 21, a first capacitor C1 may be provided at an input end of the step-up unit 21. The first end of the first capacitor C1 is connected to an input terminal of the first power supply conversion circuit 2, and the second end of the first capacitor C1 is grounded. The first capacitor C1 steps up the voltage on the secondary winding of the pulse transformer T1 by storing energy, thereby supporting stability of the operations of the step-up unit 21. Because of increasing the voltage at the input terminal of the second power supply conversion circuit, the voltage at the input terminal of the second power supply conversion circuit increases. It is beneficial to the voltage output by the secondary winding of the pulse transformer T1 stabilized above a constant value, thereby further improving the output voltage of the step-up unit 21.

Figure 8:
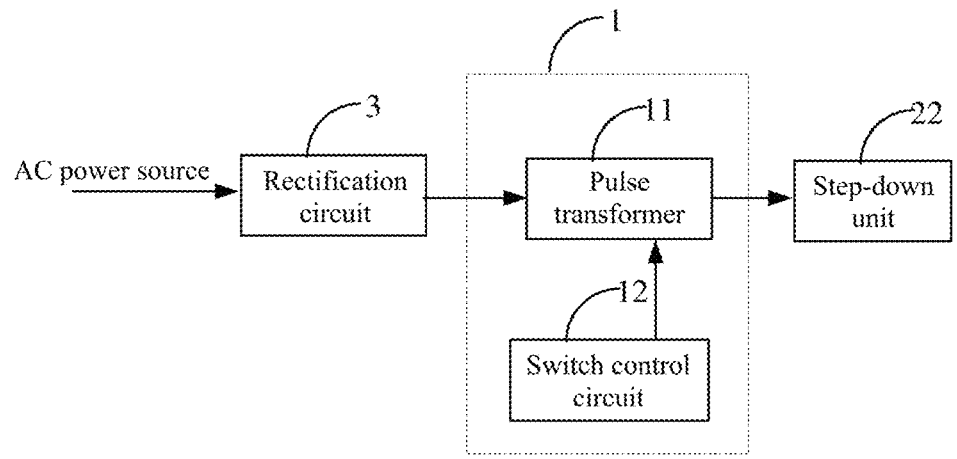
FIG. 8 is a schematic circuit diagram illustrating a power supply circuit according to another embodiment.

Referring to FIG. 8, in one embodiment, in the case of the voltage of the power supply being high, the voltage on the corresponding primary winding of the pulse transformer T1 is also high. Because the turns ratio of the pulse transformer T1 is fixed, a minimum voltage on the secondary winding of the pulse transformer T1 is correspondingly high. Therefore, in this embodiment, the first power supply conversion circuit 2 further includes a step-down unit 22. The step-down unit 22 is used to step down the output voltage of the secondary winding of the pulse transformer circuit 1 being above an upper limit value of the first preset voltage range in the case of the output voltage of the pulse transformer circuit 1 being greater than or equal to the upper limit value of the first preset voltage range, wherein the upper limit value of the first preset voltage range is less than a maximum value of the output voltage of the pulse transformer circuit 1.

The step-down unit 22 can reduce the voltage output by the secondary winding of the pulse transformer T1 to a specific value, or can reduce the voltage output by the secondary winding of the pulse transformer T1 according to a specific multiple. The step-down unit 22 includes at least one of a BUCK circuit, a BUCK/BOOST circuit, a charge pump circuit, or a CUK circuit. Herein, any one or any cascaded two of a BOOST circuit, a BUCK/BOOST circuit, a charge pump circuit, or a CUK circuit can be used to increase a step-down amplitude.

In one example, the step-down unit 22 is an uncontrollable circuit, and an operation-starting threshold of the step-down unit 22 can be adjusted by selecting components such as resistors, capacitors, and inductors with appropriate parameters. In the case of the operation-starting threshold being set to the upper limit value V1 of the preset voltage range, once the output voltage of the rectification circuit 3 rises to the upper limit value V1 of the preset voltage range, the step-down unit 22 is triggered to operate.

In another example, the step-down unit 22 is a controllable circuit. A unidirectional conduction device provided in the step-down unit 22 is a MOS transistor. The step-down unit 22 also includes a second trigger circuit that is used to control the MOS transistor to be turned on and off, so that the first trigger circuit can trigger the step-down unit 22 to operate or stop operation by turning on and off the MOS transistor. Therefore, in this example, the step-down unit further includes the second trigger circuit that is used to control the MOS transistor to be turned on and off. The second trigger circuit controls the step-down unit to start or stop an operation by controlling the MOS transistor in the step-down unit.

The step-down unit 22 being a BUCK circuit is taken as an example; diodes can be replaced with MOS transistors in the BUCK circuit, making the BUCK circuit a controllable circuit. In another aspect, because the MOS transistor has a low voltage drop, replacing the diodes in the BUCK circuit with the MOS transistor can also reduce an electric energy loss of the BUCK circuit. For other step-down units 22, for example, the diodes in the BUCK/BOOST circuit or the charge pump circuit can also be replaced with MOS transistors.

In the case of the step-down unit 22 being a controllable circuit, times for starting and stopping operations of the step-down unit 22 can be flexibly set as required, making that the step-down unit 22 can better cooperate with operations of the pulse transformer T1.

It can be understood that according to a difference of a selected pulse transformer T1 and a power supply, the voltage on the secondary winding of the pulse transformer T1 may be correspondingly different. Therefore, in a solution provided in the present disclosure, according to the voltage on the secondary winding of the pulse transformer T1, it can be selected that only the step-up unit 21 or the step-down unit 22 is used, or both the step-up unit 21 and the step-down unit 22 are used simultaneously, to adjust the voltage value on the secondary winding of the pulse transformer T1 to be within a second preset voltage range.

Figure 9:
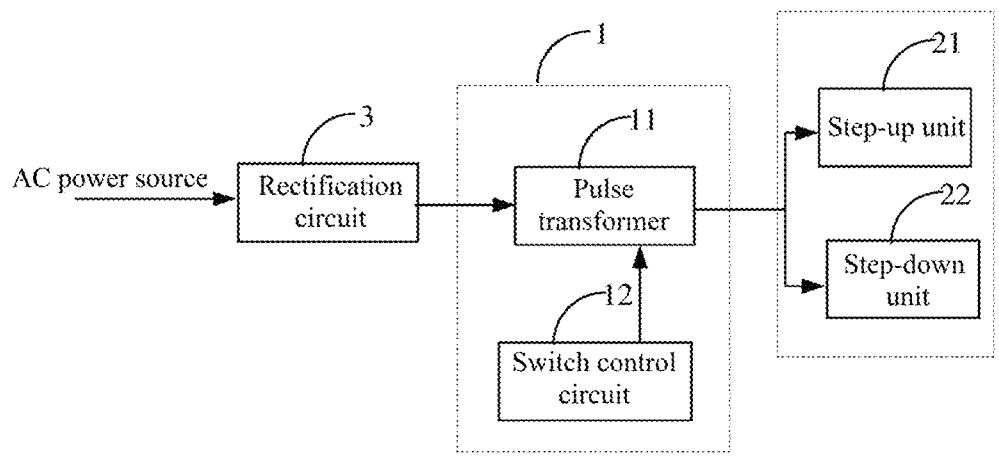
FIG. 9 is a schematic circuit diagram illustrating a power supply circuit according to another embodiment.

Please refer to FIG. 9, which is a schematic circuit diagram illustrating a power supply circuit according to another embodiment. In one embodiment, the first power supply conversion circuit 2 uses a step-up unit 21 and a step-down unit 22 simultaneously, wherein the step-up unit 21 and the step-down unit 22 are connected in parallel. The step-up unit 21 may be a circuit with only a step-up function, such as a BOOST circuit, or may be a BUCK/BOOST circuit, a charge pump circuit, and the like, that integrate step-up and step-down functions.

In a first example, the step-up unit 21 is a BOOST circuit, and the step-down unit 22 is a BUK circuit. In a second example, the step-up unit 21 is a BOOST circuit, and the step-down unit 22 is a BUCK/BOOST circuit. In a third example, the step-up unit 21 is a BUCK/BOOST circuit, and the step-down unit 22 is a BUK circuit.

In the second and third examples, because optimal operating voltage ranges for the BOOST and the BUCK/BOOST circuits or for the BUK and the BUCK/BOOST circuits are different, corresponding circuits can be selected according to the output voltage of the rectification circuit 3. For example, in the case of the voltage of 200 V being dropped to 50 V, the operation efficiency of the BUK circuit is higher. In the case of the voltage of 100 V being dropped by 50 V, the operation efficiency of the BUCK/BOOST circuit is higher. Therefore, in the case of an output voltage range of the rectification circuit 3 being about 100 V, the BUCK/BOOST circuit can be selected to operate.

Figure 10:
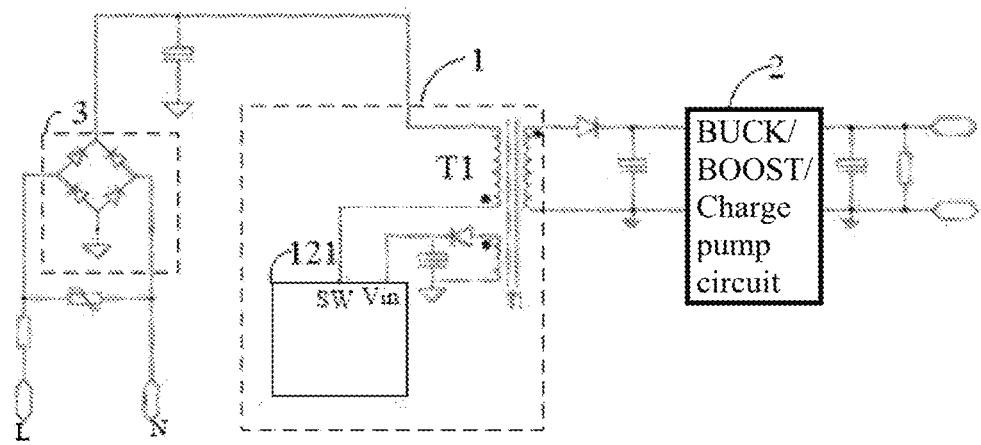
FIG. 10 is a schematic circuit diagram illustrating the power supply circuit according to an example for FIG. 9.

Please refer to FIG. 10, in another embodiment, the first power supply conversion circuit 2 includes at least one of a BUCK/BOOST circuit or a charge pump circuit. The BUCK/BOOST circuit includes a step-up unit 21 and a step-down unit 22. The charge pump circuit includes a step-up unit 21 and the step-down unit 22. In a case that the first power supply conversion circuit 2 includes a BUCK/BOOST circuit and a charge pump circuit, the BUCK/BOOST circuit and the charge pump circuit are connected in parallel.

Herein, there are three cases, the first power supply conversion circuit 2 may include only a BUCK/BOOST circuit, or only a charge pump circuit, or both a BUCK/BOOST circuit and a charge pump circuit, in which the BUCK/BOOST circuit and the charge pump circuit are connected in parallel.

In this embodiment, adaptability to the power supply is improved because the first power supply conversion circuit 2 includes a step-up unit 21 and a step-down unit 22 simultaneously. For example, in the case of the device to be charged supporting PD charging, a charging voltage required by the device to be charged will change during a charging process. Therefore, the first power supply conversion circuit 2 can increase the voltage of the secondary winding of the pulse transformer T1 or decrease the voltage of the secondary winding of the pulse transformer T1 according to the voltage required by the device to be charged, thereby providing the device to be charged with the required voltage.

Figure 11:
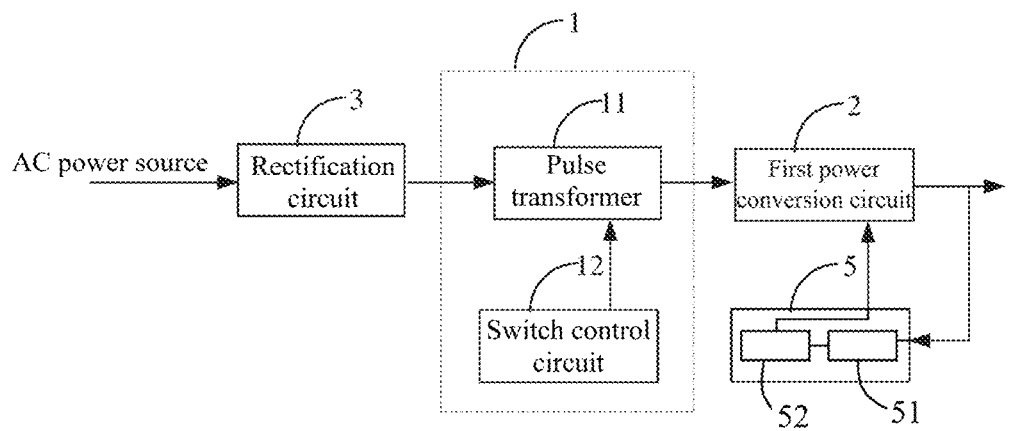
FIG. 11 is a schematic circuit diagram illustrating a power supply circuit according to another embodiment.

Please refer to FIG. 11, to further stabilize the output voltage of the first power supply conversion circuit 2, in one embodiment, the power supply circuit further includes an output control circuit 5, and the output control circuit 5 includes a feedback circuit 51 and a PWM control chip 52. The PWM control chip 52 includes a feedback reception terminal and a control terminal. One terminal of the feedback circuit 51 is connected to an output terminal of the first power supply conversion circuit 2, and another terminal of the feedback circuit 51 is connected to the feedback reception terminal of the PWM control chip 52. The control terminal of the PWM control chip 52 is connected to the first power supply conversion circuit 2 to control the output voltage of the first power supply conversion circuit 2. The PWM control chip is used to adjust the output of the control terminal according to a feedback result for the feedback circuit to stabilize the output voltage of the first power supply conversion circuit.

The feedback circuit makes the first power supply conversion circuit 2 become a closed-loop operation circuit. It can be understood by those skilled in the art that the step-up circuit and the step-down circuit generally have switching transistors for adjusting the output voltage. The PWM control chip adjusts a duty cycle for the switching transistors to adjust the output voltage of the step-up circuit and the step-down circuit accordingly. In the case of the PWM control chip receiving that a feedback voltage of the feedback circuit is too high, it will adjust the duty ratio for the switching transistors to drop the output voltage of the first power supply conversion circuit 2. Similarly, in the case of the PWM control chip receives that the feedback voltage of the feedback circuit is too low, it will adjust the duty cycle of the switching transistors to step up the output voltage of the first power supply conversion circuit 2. In this way, it ensures that the output voltage of the first power supply conversion circuit 2 is stable.

In the related art, a separate winding is usually provided on the primary side of the pulse transformer T1 to obtain voltage feedback on the pulse transformer T1. An AC-DC power supply management chip modulates the voltage on the primary winding of the pulse transformer T1 through the voltage feedback to stabilize the output voltage of the secondary winding of the pulse transformer T1. However, this voltage feedback manner has the following problems in continuous voltage regulation:

A feedback loop is longer. The device to be charged needs to communicate with the AC-DC power supply management chip in the adapter, and the AC-DC power supply management chip needs to obtain output voltage information through a feedback stage. A signal transmission path in an adjustment loop is illustrated as below, a device to be charged sending a desired voltage→a signal isolation conversion chip→an AC-DC power supply management chip→a duty cycle of a PWM signal adjusted→a sampling voltage acquired from a feedback winding of a pulse transformer T1→the duty cycle of the PWM signal adjusted→a stable output voltage obtained. It can be seen that the feedback loop is longer and real-time performance for voltage adjustment is poor.

Adjustment accuracy is poor because a feedback voltage signal is returned through a dedicated feedback winding. Still, the pulse transformer T1 has defects such as leakage of inductance and magnetic flux, and primary, secondary, and feedback windings cannot ideally realize a proportional relationship strictly determined by the turns ratio, so the output voltage of the secondary winding is controlled by returning a sampled voltage signal through the dedicated feedback winding, to make that the voltage regulation accuracy is poor.

The overall circuit occupies a large volume. In the entire power supply circuit, a circuit playing a control role (such as the AC-DC power supply management chip) is mainly provided on the primary side of the pulse transformer T1. However, the voltage on the primary side is higher, so devices provided on the primary side of the pulse transformer T1 need a higher withstand voltage capacity. But, a package of a high withstand voltage device is usually larger, resulting in a larger overall circuit volume.

In the related art, resistors are often used to divide a voltage on a secondary output side, and the voltage feedback signal of the secondary winding of the pulse transformer T1 is sent back to the AC-DC power supply management chip through a comparator and an optocoupler to control the pulse transformer T1. However, in this solution, optocouplers need to be used as signal isolation devices on the primary and secondary sides, and a feedback sample signal is transmitted back to a control chip with a long path, and the speed of the optocouplers cannot meet a higher response requirement for the power supply circuit.

In an embodiment of the present disclosure, an output control circuit 5 having a feedback circuit and a PWM control chip is provided on the secondary side of the pulse transformer T1, and the feedback circuit directly uses the voltage on the secondary winding of the pulse transformer T1, so that the PWM control chip adjusts the output voltage of the first power supply conversion circuit 2 according to the feedback result. Therefore, in this embodiment, the feedback loop does not need to transmit the feedback signal back to the primary side of the pulse transformer T1. Instead, the feedback signal is directly transmitted on the secondary side of the pulse transformer T1. Therefore, the signal transmission loop is significantly shortened and the voltage adjustment is highly real-time.

In addition, due to an isolation effect between a secondary circuit and a primary circuit of a pulse transformer T1, and an operating voltage of the secondary circuit of the pulse transformer T1 being low, the device to be charged can directly communicate with the secondary circuit of the pulse transformer T1 to achieve a voltage regulation request and the like without using optocouplers and other devices to return feedback signals or voltage regulation signals to a primary side. Therefore, the technical solution of this embodiment further reduces usage of high and low-voltage communication devices and improves response sensitivity of the feedback loop.

It can be understood that, in this embodiment, the feedback terminal of the AC-DC power supply management chip 121 does not require to receive the feedback signal. Namely, the AC-DC power supply management chip 121 does not need to adjust the voltage on the secondary winding of the pulse transformer T1 according to the feedback signal.

Further, in order to realize that the output terminal of the first power supply conversion circuit 2 is continuously adjustable, in one embodiment, the PWM control chip further includes a communication terminal. The communication terminal is used to communicate with the device to be powered to receive a supply voltage required by the device to be powered. The PWM control chip is used to control the output voltage of the first power supply conversion circuit according to the communication result with the device to be powered.

In the case of a device to be charged and a charging device that support a PD charging protocol and a private charging protocol, during a charging process, the device to be charged communicates with the PWM control chip, and the device to be charged transmits a required charging voltage and charging current to the PWM control chip. The PWM control chip further controls the first power supply conversion circuit 2 to adjust the output voltage to meet charging requirements of the device to be charged.

Figure 12:
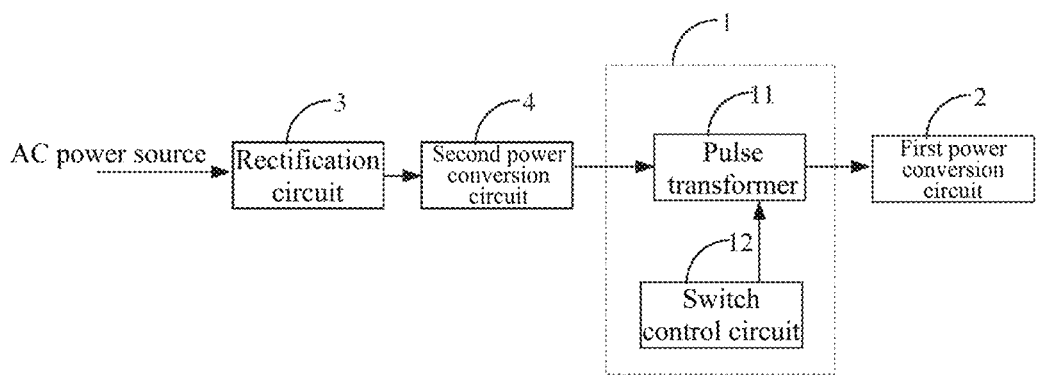
FIG. 12 is a schematic circuit diagram illustrating a power supply circuit according to another embodiment.

Please refer to FIG. 12, which is a schematic circuit diagram illustrating a power supply circuit according to another embodiment. Based on the above-mentioned embodiments, in order to improve the adjustment range of the output voltage of the power supply circuit in the present disclosure, it is provided that the power supply circuit further includes a second power supply conversion circuit 4. An input terminal of the second power supply conversion circuit 4 is connected to the output terminal of the rectification circuit 3, and an output terminal of the second power supply conversion circuit is connected to the primary winding of the pulse transformer T1. In the case of the voltage output by the rectification circuit 3 being out of a second preset voltage range, the second power supply conversion circuit is used to adjust the voltage output by the rectification circuit 3 to be within the second preset voltage range. For the explanation of the second preset voltage range, reference may be made to the explanation of the first preset voltage range mentioned above.

The second power supply conversion circuit can replace the filter circuit mentioned in the above embodiment. The filter circuit needs to use inductors with a higher inductance value and capacitors with a higher capacitance value. Thus the volume of the inductors and capacitors in the filter circuit is larger. Therefore, in order to reduce the volume of the charging device and facilitate the miniaturization of the charging device, in this embodiment, a second power supply conversion circuit is used to adjust the output voltage of the rectification circuit 3. Due to a circuit structure of the second power supply conversion circuit, it is possible to use inductors with a lower inductance value and capacitors with a lower capacitance value. Thus, it is beneficial to reduce the volume of the inductors and the capacitors, which in turn is beneficial to reduce the volume of the charging device.

Embodiments of the second power supply conversion circuit will be described below with reference to the above embodiments.

It can be seen from the above embodiment that a voltage waveform output by the rectification circuit 3 is roughly a steamed-bread wave, and a voltage amplitude varies between the highest voltage and the lowest voltage, wherein the lowest voltage may be close to 0 V. It can be understood that in the case of the voltage output by the rectification circuit 3 being close to 0 V, the primary winding of the pulse transformer T1 cannot start operations, which makes the secondary output of the pulse transformer T1 unstable.

Figure 13:
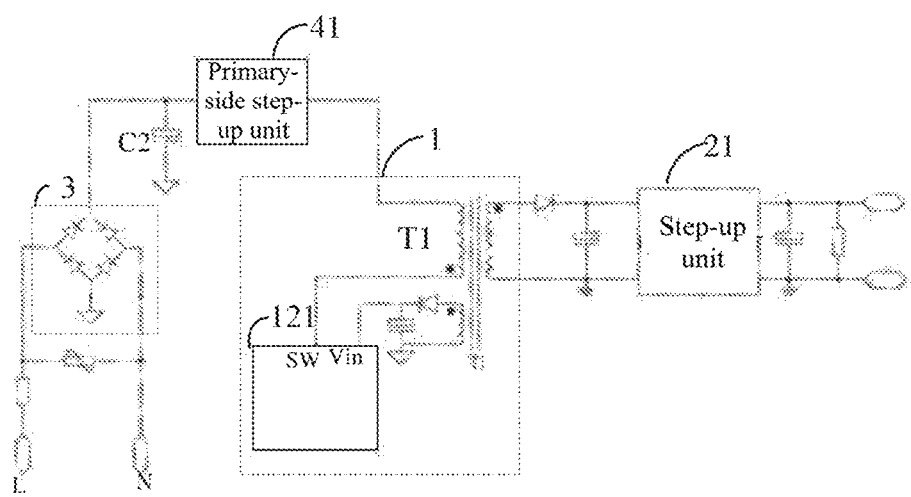
FIG. 13 is a schematic circuit diagram illustrating the power supply circuit according to an example for FIG. 12.

Please refer to FIG. 13. In one embodiment, the second power supply conversion circuit includes a step-up unit 21. The step-up unit 21 is used to step up the output voltage of the rectification circuit 3 in the case of the output voltage of the rectification circuit 3 being less than or equal to the lower limit value V2 of the second preset voltage range. The lower limit value V2 of the second preset voltage range is greater than the minimum operating voltage of the pulse transformer circuit 1.

It can be understood that, according to a difference in the pulse transformer circuit 1 used, the minimum operating voltage thereof will be different. Those skilled in the art can know the minimum operating voltage of the pulse transformer circuit 1 used by experience or through experiments. The minimum operating voltage of the pulse transformer T1 and the AC-DC power supply management chip 121 is generally the minimum operating voltage of the pulse transformer circuit 1.

In the case of the voltage output by the rectification circuit 3 being less than the lower limit value of the second preset voltage range, the step-up unit 21 will start to operate to step up a portion of the voltage output by the rectification circuit 3 being lower than the lower limit value of the second preset voltage range.

A primary-side step-up unit 41 can step up the voltage output by the rectification circuit 3 to a specific value, or can step up the voltage output by the rectification circuit 3 according to a specific multiple. The step-up unit 21 includes one or more of one unitary primary-side step-up unit 41, a plurality of cascaded unitary primary-side step-up units 41, a BUCK/BOOST circuit, and a charge pump circuit. It can be understood that the BUCK/BOOST circuit and the charge pump circuit can both implement the step-up or step-down function as required. Herein, the one unitary primary-side step-up unit 41 may be a BOOST circuit. In the case of a plurality of primary-side step-up units 41 being cascaded, the step-up amplitude can be increased.

In one example, the step-up unit 21 is an uncontrollable circuit. An operation-starting threshold can be adjusted by selecting components such as resistors, capacitors, and inductors with appropriate parameters. In the case of the operation-starting threshold being set to the lower limit value of the second preset voltage range, once the output voltage of the rectification circuit 3 steps down to the lower limit value of the second preset voltage range, the step-up unit 21 is triggered to operate.

In another example, the step-up unit 21 is a controllable circuit. A unidirectional conduction device provided in the step-up unit 21 is a MOS transistor. The step-up unit 21 and the primary-side step-up unit 41 also include a first trigger circuit that is used to control the MOS transistor to be turned on and off, so that the first trigger circuit can trigger the step-up unit 21 to operate or stop operation by turning on and off the MOS transistor.

For one example, a step-up unit 21 is a BOOST circuit. In the BOOST circuit, diodes can be replaced with MOS transistors, making the BOOST circuit a controllable circuit. In another aspect, because the MOS transistor has a low voltage drop, replacing the diodes in the BOOST circuit with the MOS transistor can also reduce electric energy loss of the BOOST circuit, which is beneficial to improve the output voltage of the BOOST circuit. For other step-up units 21, for example, diodes in the BUCK/BOOST circuit and the charge pump circuit can also be replaced with MOS transistors.

In the case of the step-up unit 21 being a controllable circuit, times for starting and stopping operations of the step-up unit 21 can be flexibly set as required, making that the step-up unit 21 can better cooperate with the rectification circuit 3 and the pulse transformer circuit 1, thereby that the voltage processed by the step-up unit 21 can fully satisfy an operating voltage of the pulse transformer circuit 1.

In an embodiment, in order to further retain the voltage output by the primary-side step-up unit 41, a second capacitor C2 may be provided at an input end of the primary-side step-up unit 41, wherein a first end of the second capacitor C2 is connected to the input terminal of the second power supply conversion circuit, and a second end of the second capacitor C2 is grounded. The second capacitor C2 can step up the voltage of the input terminal of the second power supply conversion circuit by storing energy, thereby supporting the stability of the operation of the primary-side step-up unit 41. Because the voltage of the input terminal of the second power supply conversion circuit is stepped up, the voltage at the input terminal of the second power supply conversion circuit is increased. It is beneficial to stabilize the input voltage of the primary winding of the pulse transformer T1 above a fixed value and improve an operating dead zone of the pulse transformer T1.

Figure 14:
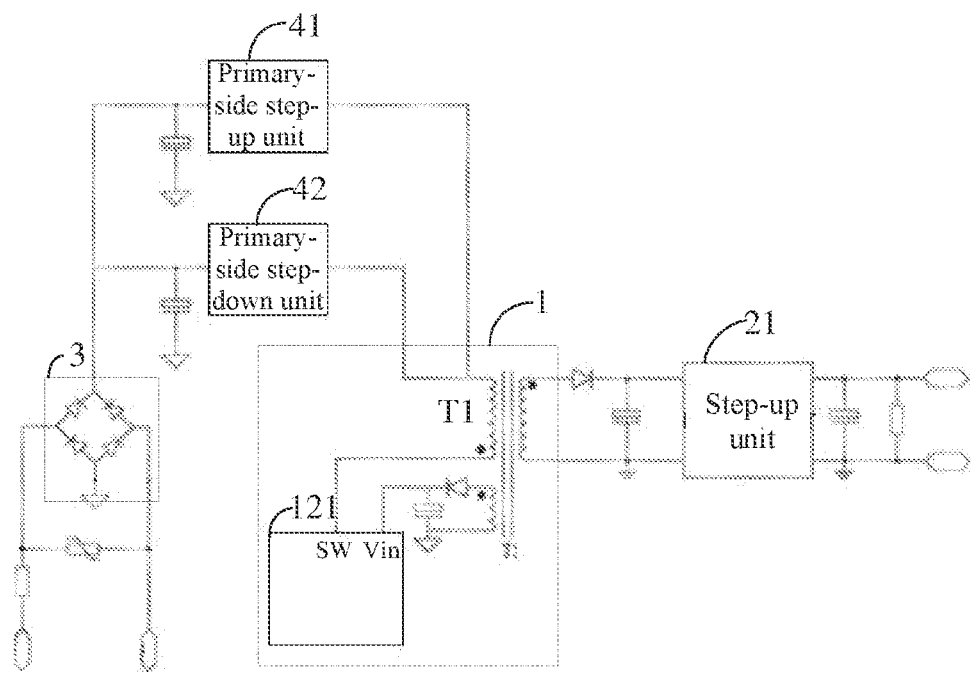
FIG. 14 is a schematic circuit diagram illustrating the power supply circuit according to another example for FIG. 12.

Please refer to FIG. 14. Further, in order to further improve the stability of a primary-side voltage of the pulse transformer T1. In one embodiment, the second power supply conversion circuit further includes a primary-side step-down unit 42. The primary-side step-down unit 42 is used to step down the voltage of the rectification circuit 3 in the case of the output voltage of the rectification circuit 3 being greater than or equal to the upper limit value of the second preset voltage range, wherein the upper limit value of the second preset voltage range is less than the maximum value of the output voltage of the rectification circuit 3.

In the case of the voltage output by the rectification circuit 3 being higher than the lower limit value of the second preset voltage range, the primary-side step-down unit 42 will start to operate to step up a portion of the voltage output by the rectification circuit 3 being higher than the upper limit value of the second preset voltage range.

The primary-side step-down unit 41 can step down the voltage output by the rectification circuit 3 to a specific value, or can step down the voltage output by the rectification circuit 3 according to a specific multiple. The primary-side step-down unit 42 includes one or more of one unitary primary-side step-down unit 42, a plurality of cascaded unitary primary-side step-down units 42, a BUCK/BOOST circuit, and a charge pump circuit. Herein, the one unitary primary-side step-down unit 42 can be a BUCK circuit. In the case of a plurality of primary-side step-down units 42 being cascaded, the step-down range can be increased.

In one example, the primary-side step-down unit 42 is an uncontrollable circuit. An operation-starting threshold of the primary-side step-down unit 42 can be adjusted by selecting components such as resistors, capacitors, and inductors with appropriate parameters. In the case of the operation-starting threshold being set to the upper limit value V1 of the second preset voltage range, once the output voltage of the rectification circuit 3 rises to the upper limit value V1 of the second preset voltage range, the primary-side step-down unit 42 is triggered to operate.

In another example, the primary-side step-down unit 42 is a controllable circuit. A unidirectional conduction device provided in the primary-side step-down unit 42 is a MOS transistor. The primary-side step-down unit 42 also includes a second trigger circuit that is used to control the MOS transistor to be turned on and off, such that the first trigger circuit can trigger the primary-side step-down unit 42 to operate or stop operation by turning on and off the MOS transistor.

Taking the primary-side step-down unit 42 being a BUCK circuit as an example: diodes can be replaced with MOS transistors in the BUCK circuit, thereby making the BUCK circuit a controllable circuit. In another aspect, because the MOS transistor has a low voltage drop, replacing the diodes in the BUCK circuit with the MOS transistor can also reduce an electric energy loss of the BUCK circuit for other primary-side step-down units 42, for example, diodes in the BUCK/BOOST circuit and the charge pump circuit can also be replaced with MOS transistors.

In the case of the primary-side step-down unit 42 being a controllable circuit, times for starting and stopping operations of the primary-side step-down unit 42 can be flexibly set as required, making the primary-side step-down unit 42 can better cooperate with the rectification circuit 3 and the pulse transformer T1 circuit 1.

It can be understood that, depending on different selected rectification circuit 3, the output waveform of the rectification circuit 3 may be correspondingly different. Therefore, in the solution of the present disclosure, according to the output waveform of the rectification circuit 3, it can be selected to use only the primary-side step-up unit 41 or the primary-side step-down unit 42, or to use the primary-side step-up unit 41 and the primary-side step-down unit 42 simultaneously, to adjust the output voltage of the rectification circuit 3 to be within the second preset voltage range.

Generally, the power supply circuit is divided into a forward circuit and a flyback circuit. Correspondingly, the pulse transformer T1 may be a forward pulse transformer T1 or a flyback pulse transformer T1. The forward pulse transformer T1 has higher requirements on the voltage stability on the primary winding of the pulse transformer T1. In this embodiment, the voltage on the primary winding of the pulse transformer T1 is relatively stable by providing the step-up unit 21 and the primary-side step-down unit 42, so that both are suitable for the forward pulse transformer T1 and the flyback pulse transformer T1. In the case of the pulse transformer T1 adopting the forward pulse transformer T1, the stability of the output voltage on the negative winding of the pulse transformer T1 can be improved, and the power output capability can be improved, so that the power supply circuit can be used in high-power applications.

Please refer to FIG. 14. In one embodiment, the power supply circuit simultaneously uses the step-up unit 21 and the primary-side step-down unit 42. The step-up unit 21 and the primary-side step-down unit 42 are connected in parallel. The step-up unit 21 may be a circuit with only a step-up function, such as a BOOST circuit, or be a BUCK/BOOST circuit, a charge pump circuit, and the like that integrate step-up and step-down functions.

In a first example, the step-up unit 21 is a BOOST circuit, and the primary-side step-down unit 42 is a BUK circuit. In a second example, the step-up unit 21 is a BOOST circuit, and the primary-side step-down unit 42 is a BUCK/BOOST circuit. In a third example, the step-up unit 21 is a BUCK/BOOST circuit, and the primary-side step-down unit 42 is a BUK circuit.

In the second and third examples, because optimal operating voltage ranges for the BOOST and the BUCK/BOOST circuits or for the BUK and the BUCK/BOOST circuits are different, corresponding circuits can be selected according to the output voltage of the rectification circuit 3. For example, in the case of the voltage of 200 V being dropped to 50 V, the operation efficiency of the BUK circuit is higher. In the case of the voltage of 100 V being dropped by 50 V, the operation efficiency of the BUCK/BOOST circuit is higher. Therefore, in the case of the output voltage range of the rectification circuit 3 being about 100 V, the BUCK/BOOST circuit can be selected for operations.

In another embodiment, the second power supply conversion circuit includes at least one of a BUCK/BOOST circuit or a charge pump circuit. The BUCK/BOOST circuit includes a step-up unit 21 and a primary-side step-down unit 42. The charge pump circuit includes a step-up unit 21 and a primary-side step-down unit 42. In a case in which the second power supply conversion circuit includes a BUCK/BOOST circuit and a charge pump circuit, the BUCK/BOOST circuit and the charge pump circuit are connected in parallel.

Herein, there are three cases, the second power supply conversion circuit may include only a BUCK/BOOST circuit, only a charge pump circuit, or both a BUCK/BOOST circuit and a charge pump circuit, wherein the BUCK/BOOST circuit and the charge pump circuit are connected in parallel.

The technical solution of the present disclosure is provided with the second power supply conversion circuit to adjust the output voltage of the rectification circuit 3 to be within the second preset voltage range in the case of the voltage output by the rectification circuit 3 being out of the second preset voltage range, thereby effectively reducing or eliminating the operation dead zone of the pulse transformer T1 circuit 1, so that two-stage power supply conversion can obtain sufficient voltage supply at each moment. Then, the pulse transformer T1 circuit 1 can output a continuous and stable voltage to supply the first power supply conversion circuit 2 for operating to improve accuracy of the output voltage of the power supply circuit.

Figure 15:
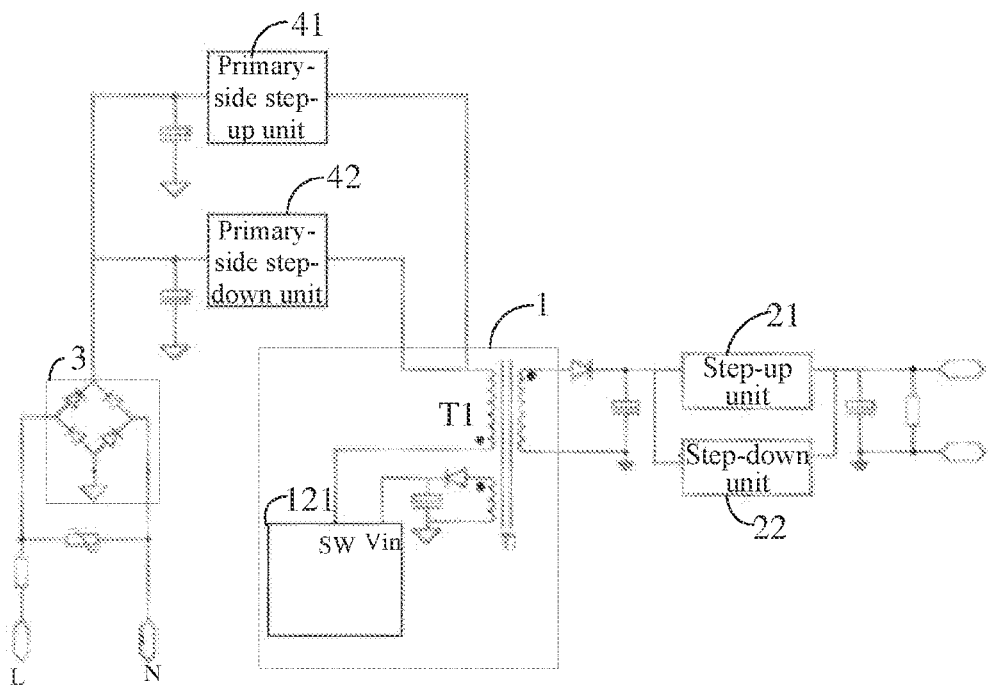
FIG. 15 is a schematic circuit diagram illustrating a power supply circuit according to another example for FIG. 12.

Please refer to FIG. 15, the first power supply conversion circuit 2 and the second power supply conversion circuit can cooperate in various ways.

In one example, in the case of a power supply voltage being low, or the case of a device to be powered requiring a higher supply voltage, the primary-side step-up unit 41 of the second power supply conversion can be used to cooperate with the step-up unit 21 of the first power supply conversion circuit 2, to improve the overall step-up range of the power supply circuit.

In one example, in the case of a power supply voltage being high, or in the case of a device to be powered requiring a lower supply voltage, the primary-side step-down unit 42 of the second power supply conversion can be used to cooperate with the step-down unit 22 of the first power supply conversion circuit 2, to improve the overall step-down range of the power supply circuit.

In one example, in the case of a power supply voltage being high, or in the case of a device to be powered requiring a lower supply voltage, the primary-side step-down unit 42 of the second power supply conversion can be used to cooperate with the step-down unit 22 of the first power supply conversion circuit 2, to improve the overall step-down range of the power supply circuit.

In one example, the primary-side step-up unit 41 of the second power supply conversion can be used to cooperate with the step-down unit 22 of the first power supply conversion circuit 2. The primary-side step-up unit 41 steps up the voltage on the primary side of the pulse transformer T1 first, so that the voltage on the secondary side of the pulse transformer T1 is also correspondingly stepped up. Accordingly, the voltage is stepped up to the required voltage of the device to be charged, to which the voltage of the secondary side of the pulse transformer T1 can be converted by only the step-down unit 22 of the first power supply conversion circuit 2 required for operating. Therefore, in this example, it is not necessary to provide the step-up unit 21 in the first power supply conversion circuit 2, thereby simplifying the circuit structure.

In another example, the primary-side step-down unit 42 of the second power supply conversion can be used to cooperate with the step-up unit 21 of the first power supply conversion circuit 2. The primary-side step-down unit 42 first reduces the voltage on the primary side of the pulse transformer T1, so that the voltage on the secondary side of the pulse transformer T1 is correspondingly reduced. Accordingly, the voltage is stepped up to the required voltage of the device to be charged, to which the voltage of the secondary side of the pulse transformer T1 can be converted by only the step-up unit 21 of the first power supply conversion circuit 2 required for operating. Therefore, in this example, it is not necessary to provide the step-down unit 22 in the first power supply conversion circuit 2, thereby simplifying the circuit structure.

While the present disclosure has been described with reference to several exemplary embodiments, it should be understood that the terminology is used for description and illustration and not to be limited. Because the present disclosure can be embodied in many forms without departing from the spirit or spirit of the present disclosure, it should be understood that the above-described embodiments are not limited to any of the foregoing details but are to be construed broadly within the spirit and scope defined by the appended claims. Therefore, all changes and modifications that fall within the scope of the claims or their equivalents should be covered by the appended claims.

What is claimed is:

1. A power supply circuit, comprising:
   a transformer circuit comprising a pulse transformer and a switch control circuit; wherein a primary winding of the pulse transformer is connected to a power supply and the switch control circuit, and the switch control circuit is configured to modulate a voltage on the primary winding into a pulse voltage; and
   a first power supply conversion circuit, wherein an input terminal of the first power supply conversion circuit is connected to a secondary winding of the pulse transformer to convert a voltage on the secondary winding of the pulse transformer to be within a first preset voltage range and then to be output in the case of a voltage output by the secondary winding being out of the first preset voltage range, and an upper limit value of the first preset voltage range is less than a maximum value of an output voltage of the transformer circuit.

2. The power supply circuit as claimed in claim 1, wherein the first power supply conversion circuit comprises a step-up unit that is configured to step up a voltage on the secondary winding of the pulse transformer being below a lower limit value of the first preset voltage range in the case of the output voltage of the transformer circuit being less than or equal to the lower limit value of the first preset voltage range.

3. The power supply circuit as claimed in claim 2, wherein the step-up unit comprises at least one of a BOOST circuit, a BUCK/BOOST circuit, a charge pump circuit, or a CUK circuit.

4. The power supply circuit as claimed in claim 2, wherein the power supply circuit further comprises a first capacitor, wherein a first end of the first capacitor is connected to the input terminal of the first power supply conversion circuit, a second end of the first capacitor is grounded, and the first capacitor is configured to step up a voltage of the input terminal of the first power supply conversion circuit.

5. The power supply circuit as claimed in claim 2, wherein the first power supply conversion circuit further comprises a step-down unit: the step-down unit is configured to step down a voltage on the secondary winding of the pulse transformer being above the upper limit value of the first preset voltage range in the case of the output voltage of the transformer circuit being greater than or equal to the upper limit value of the first preset voltage range.

6. The power supply circuit as claimed in claim 5, wherein the step-down unit comprises at least one of a BUCK circuit, a BUCK/BOOST circuit, a charge pump circuit, or a CUK circuit.

7. The power supply circuit as claimed in claim 5, wherein a unidirectional conduction device provided in the step-up unit is a MOS transistor; the step-up unit further comprises a first triggering circuit that is configured to control the MOS transistor to be turned on and off; the first triggering circuit is configured to control the step-up unit to start or stop an operation by controlling the MOS transistor in the step-up unit:
   a unidirectional conduction device provided in the step-down unit is a MOS transistor; the step-down unit further comprises a second triggering circuit: the second triggering circuit is configured to control the MOS transistor to be turned on and off: the second triggering circuit is configured to control the step-down unit to start or stop an operation by controlling the MOS transistor in the step-down unit.

8. The power supply circuit as claimed in claim 1, wherein the power supply circuit further comprises an output control circuit comprising a feedback circuit and a PWM control chip: the PWM control chip comprises a feedback reception terminal and a control terminal:
   one terminal of the feedback circuit is connected to the output terminal of the first power supply conversion circuit, and another terminal of the feedback circuit is connected to the feedback reception terminal of the PWM control chip; the control terminal of the PWM control chip is connected to the first power supply conversion circuit to control an output voltage of the first power supply conversion circuit;
   the PWM control chip is configured to adjust an output of the control terminal according to a feedback result for the feedback circuit to stabilize the output voltage of the first power supply conversion circuit.

9. The power supply circuit as claimed in claim 8, wherein the PWM control chip further comprises a communication terminal: the communication terminal is configured to communicate with a device to be powered to receive a supply voltage required by the device to be powered:
   the PWM control chip is configured to control the output voltage of the first power supply conversion circuit according to a communication result with the device to be powered.

10. The power supply circuit as claimed in claim 1, wherein the power supply circuit further comprises a second power supply conversion circuit and a rectification circuit:
    an input terminal of the rectification circuit is connected to an alternating current (AC) power supply to rectify the AC power supply;
    an input terminal of the second power supply conversion circuit is connected to an output terminal of the rectification circuit, and an output terminal of the second power supply conversion circuit is connected to the primary winding of the pulse transformer;
    the second power supply conversion circuit is configured to adjust a voltage output by the rectification circuit to be within a second preset voltage range in the case of the voltage output by the rectification circuit being out of the second preset voltage range.

11. The power supply circuit as claimed in claim 10, wherein the switch control circuit comprises an AC-DC power supply management chip: the AC-DC power supply management chip has a switch control terminal:
    a first end of the primary winding of the pulse transformer is connected to the output terminal of the second power supply conversion circuit, and a second end of the primary winding is connected to a switch control terminal of the AC-DC power supply management chip, to modulate the voltage on the primary winding.

12. A charging device, comprising a power supply inlet and a power supply circuit, wherein the power supply inlet is configured to receive power supply; the power supply circuit comprises:
    a transformer circuit comprising a pulse transformer and a switch control circuit; wherein a primary winding of the pulse transformer is connected to a power supply and the switch control circuit, and the switch control circuit is configured to modulate a voltage on the primary winding into a pulse voltage; and
    a first power supply conversion circuit, wherein an input terminal of the first power supply conversion circuit is connected to a secondary winding of the pulse transformer to convert a voltage on the secondary winding of the pulse transformer to be within a first preset voltage range and then to be output in the case of a voltage output by the secondary winding being out of the first preset voltage range, and an upper limit value of the first preset voltage range is less than a maximum value of an output voltage of the transformer circuit.

13. The charging device as claimed in claim 12, wherein the first power supply conversion circuit comprises a step-up unit that is configured to step up a voltage on the secondary winding of the pulse transformer being below a lower limit value of the first preset voltage range in the case of the output voltage of the transformer circuit being less than or equal to the lower limit value of the first preset voltage range.

14. The charging device as claimed in claim 13, wherein the power supply circuit further comprises a first capacitor, wherein a first end of the first capacitor is connected to the input terminal of the first power supply conversion circuit, a second end of the first capacitor is grounded, and the first capacitor is configured to step up a voltage of the input terminal of the first power supply conversion circuit.

15. The charging device as claimed in claim 13, wherein the first power supply conversion circuit further comprises a step-down unit; the step-down unit is configured to step down a voltage on the secondary winding of the pulse transformer being above the upper limit value of the first preset voltage range in the case of the output voltage of the transformer circuit being greater than or equal to the upper limit value of the first preset voltage range.

16. The charging device as claimed in claim 15, wherein a unidirectional conduction device that is provided in the step-up unit is a MOS transistor: the step-up unit further comprises a first triggering circuit that is configured to control the MOS transistor to be turned on and off; the first triggering circuit is configured to control the step-up unit to start or stop an operation by controlling the MOS transistor in the step-up unit:
   a unidirectional conduction device that is provided in the step-down unit is a MOS transistor; the step-down unit further comprises a second triggering circuit: the second triggering circuit is configured to control the step-down unit to start or stop an operation by controlling the MOS transistor in the step-down unit.

17. The charging device as claimed in claim 12, wherein the power supply circuit further comprises an output control circuit comprising a feedback circuit and a PWM control chip: the PWM control chip comprises a feedback reception terminal and a control terminal:
   one terminal of the feedback circuit is connected to the output terminal of the first power supply conversion circuit, and another terminal of the feedback circuit is connected to the feedback reception terminal of the PWM control chip; the control terminal of the PWM control chip is connected to the first power supply conversion circuit to control an output voltage of the first power supply conversion circuit;
   the PWM control chip is configured to adjust an output of the control terminal according to a feedback result for the feedback circuit to stabilize the output voltage of the first power supply conversion circuit.

18. The charging device as claimed in claim 17, wherein the PWM control chip further comprises a communication terminal: the communication terminal is configured to communicate with a device to be powered to receive a supply voltage required by the device to be powered;
   the PWM control chip is configured to control the output voltage of the first power supply conversion circuit according to a communication result with the device to be powered.

19. The charging device as claimed in claim 12, wherein the power supply circuit further comprises a second power supply conversion circuit and a rectification circuit:
   an input terminal of the rectification circuit is connected to an alternating current (AC) power supply to rectify the AC power supply;
   an input terminal of the second power supply conversion circuit is connected to an output terminal of the rectification circuit, and an output terminal of the second power supply conversion circuit is connected to the primary winding of the pulse transformer;
   the second power supply conversion circuit is configured to adjust a voltage output by the rectification circuit to be within a second preset voltage range in the case of the voltage output by the rectification circuit being out of the second preset voltage range.

20. The charging device as claimed in claim 19, wherein the switch control circuit comprises an AC-DC power supply management chip: the AC-DC power supply management chip has a switch control terminal:
   a first end of the primary winding of the pulse transformer is connected to the output terminal of the second power supply conversion circuit, and a second end of the primary winding is connected to a switch control terminal of the AC-DC power supply management chip, to modulate the voltage on the primary winding.

* * * * *